United States Patent
Gammie et al.

(10) Patent No.: US 7,196,581 B2
(45) Date of Patent: Mar. 27, 2007

(54) AMPLIFIER SWITCHING CONTROL CIRCUIT AND METHOD FOR CURRENT SHUNT INSTRUMENTATION AMPLIFIER HAVING EXTENDED POSITION AND NEGATIVE INPUT COMMON MODE RANGE

(75) Inventors: David A. Gammie, Tucson, AZ (US); Sergey V. Alenin, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 127 days.

(21) Appl. No.: 11/134,122

(22) Filed: May 20, 2005

(65) Prior Publication Data

US 2006/0261884 A1    Nov. 23, 2006

(51) Int. Cl.
*H03F 3/45* (2006.01)
(52) U.S. Cl. ..................................... 330/259
(58) Field of Classification Search ............... 330/259, 330/9, 85
See application file for complete search history.

(56) References Cited

U.S. PATENT DOCUMENTS 5,276,405 A * 1/1994 Mazzucco et al. ......... 330/257
6,538,503 B2 * 3/2003 Burt ............................. 330/9
2006/0122529 A1 * 6/2006 Tsau ........................ 600/544

* cited by examiner

*Primary Examiner*—Robert Pascal
*Assistant Examiner*—Hieu Nguyen
(74) *Attorney, Agent, or Firm*—W. James Brady, III; Frederick J. Telecky, Jr.

(57) ABSTRACT

An amplifier circuit includes first (7A) and second (7B) operational amplifiers connected in a generally parallel configuration, each with inputs coupled through the same pair of matched input resistors which receive a differential input signal that may have both a positive and negative common mode range. An offset adjustment amplifier (17) receives a differential error signal representative of the difference between offset voltages of the first and second operational amplifiers and generates offset adjustment signals that are applied to input stages of the first and second operational amplifiers to adjust their respective offset voltages so as to equalize them. With the offset voltages equalized, the first and second operational amplifiers operate seamlessly as a common mode component of the differential input signal undergoes a transition from its positive to its negative range, so as to avoid inaccuracies and abrupt changes in an output voltage during the transition, the output voltage being produced in response to outputs of both first and second operational amplifiers.

20 Claims, 3 Drawing Sheets

AMPLIFIER SWITCHING CONTROL CIRCUIT AND METHOD FOR CURRENT SHUNT INSTRUMENTATION AMPLIFIER HAVING EXTENDED POSITION AND NEGATIVE INPUT COMMON MODE RANGE

BACKGROUND OF THE INVENTION

The present invention relates generally to instrumentation amplifiers, and more particularly to circuitry and techniques for providing "seamless" or continuous circuit operation between positive and negative portions of a common mode input range.

Figure 1:
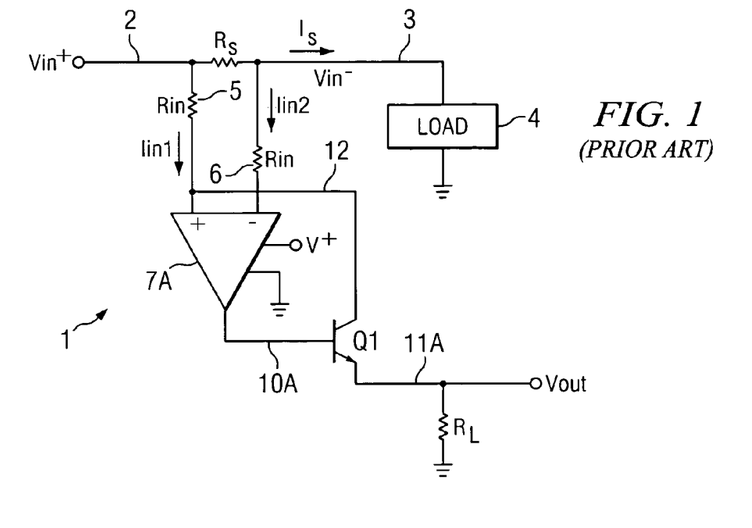
FIG. 1 is a schematic diagram of a prior art instrumentation amplifier that is operable only with a positive common mode input voltage.

The closest prior art is believed to be the assignee's INA 168 positive common mode voltage instrumentation amplifier, a diagram of which is shown in FIG. 1. Referring to FIG. 1, prior art instrumentation amplifier 1 has positive common mode voltage operation between a single supply voltage V+ and ground. Amplifier 1 includes an operational amplifier 7A having a (+) input coupled by a conductor 12 to one terminal of a precision input resistor 5, which may, for example, have a resistance Rin equal to 5 kilohms. The other terminal of resistor 5 is coupled by a conductor 2 to receive an input voltage Vin+ and also is connected to one terminal of a sense resistor $R_s$, the other terminal of which is connected by a conductor 3 to one terminal of an external load 4, the other terminal of which is connected to ground. Sense resistor $R_S$ has a very low resistance, typically 10 milliohms, and a current $I_S$ flows through sense resistor $R_S$ into load 4 in response to a positive value of Vin+. The current $I_S$ develops a small sense voltage across sense resistor $R_S$. Conductor 3 is connected to one terminal of another precision input resistor 6, which also has the same resistance Rin. The other terminal of resistor 6 is connected to the (−) input of operational amplifier 7A. Resistor 6 is precisely matched to resistor 5.

The output of operational amplifier 7A is connected by a conductor 10A to the base of an NPN transistor Q1, the emitter of which is connected by an output conductor 11A to one terminal of a load resistor $R_L$, the other terminal of which is connected to ground. The collector of transistor Q1 is connected by conductor 12 to provide feedback to the (+) input of operational amplifier 7A. Positive common mode voltage instrumentation amplifier 1 thus precisely measures the voltage across sense resistor $R_s$ and produces an output voltage Vout on output conductor 11A, where Vout=$(I_S)(R_S)(R_L)$/Rin. Thus, Vout accurately represents the current $I_S$ supplied to load 4 by Vin+.

The resistance of sense resistor $R_S$ is small, typically approximately 10 milliohms to 1 ohm, depending on the value of IS. The voltage on either conductor 2 or conductor 3 of FIG. 1 can be considered to be the positive common mode voltage. The supply voltage V+ typically has a value in the range from a few volts up to approximately +18 volts. Vin+ can be any value from roughly 1.4 volts to roughly 60 volts. The feedback provided by transistor Q1 keeps the voltage difference between the (+) and (−) inputs of operational amplifier 7A at nearly zero, and the current $I_{in2}$ through resistor 6, and hence the resulting voltage drop across it, are essentially zero. Therefore, the voltage across resistor $R_s$ is equal to the voltage developed across 5 kilohm resistor 5. This voltage across resistor 5 produces a current $I_{in1}$ that flows through transistor Q1 and resistor $R_L$.

The common mode voltage on conductor 3 must be positive, because amplifier 7A will turn transistor Q1 off, causing positive common mode voltage instrumentation amplifier 1 to be inoperative if Vin+ is below ground.

There are various applications of positive common mode voltage instrumentation amplifier 1 of prior art FIG. 1, including automotive applications in which both positive and negative transient voltages may occur. However, in such applications, positive common mode voltage instrumentation amplifier 1 may produce undesirable "glitches" in the output voltage Vout.

Thus, there is an unmet need for an instrumentation amplifier which has a wide common mode input voltage range in order to effectively reject both positive and negative transient voltage spikes.

There also is an unmet need for such an instrumentation amplifier that also provides a low output impedance.

There also is an unmet need for an instrumentation amplifier which has a wide common mode input voltage range and which avoids producing abrupt changes and/or inaccuracies in its output signal if the common mode input voltage applied to the instrumentation amplifier undergoes a transition from a positive to a negative value or vice versa.

SUMMARY OF THE INVENTION

It is an object of the present invention to provide an instrumentation amplifier which has a wide common mode input voltage range in order to effectively reject both positive and negative transient voltage spikes.

It is another object of the present invention to provide such an instrumentation amplifier that also provides a low impedance voltage output signal.

It is another object of the invention to provide an instrumentation amplifier which has a wide common mode input voltage range and which avoids producing abrupt changes and/or inaccuracies in its output signal if the common mode input voltage applied to the instrumentation amplifier undergoes a transition from a positive to a negative value or vice versa.

Briefly described, and in accordance with one embodiment, the present invention provides an amplifier circuit including first (7A) and second (7B) operational amplifiers connected in a generally parallel configuration, each with inputs coupled through the same pair of matched input resistors which receive a differential input signal that may have both a positive and negative common mode range. An offset adjustment amplifier (17) receives a differential error signal representative of the difference between offset voltages of the first and second operational amplifiers and generates offset adjustment signals that are applied to the input stage of at least one of the first and second operational amplifiers to adjust their respective offset voltages so as to equalize them. With the offset voltages equalized, the first and second operational amplifiers operate seamlessly as a common mode component of the differential input signal undergoes a transition from its positive to its negative range, so as to avoid inaccuracies and abrupt changes in an output voltage during the transition, the output voltage being produced by the first and second operational amplifiers.

In the described embodiments, an instrumentation amplifier circuit (100) including a first operational amplifier (7A) having a non-inverting input coupled to a first terminal of a first input resistor (5), an inverting input coupled to a first terminal of a second input resistor (6), and an output (10A) coupled to a control electrode (e.g., base) of a first output transistor (Q1). The first output transistor (Q1) has a first electrode (e.g., emitter) coupled to a first output conductor (11AB) and a first terminal of a load resistor ($R_L$) and a second electrode (e.g., collector) coupled to the first terminal of the first resistor (5), the load resistor ($R_L$) having a second terminal coupled to a first reference voltage (GND). A differential input voltage is applied between a second terminal (2) of the first input resistor (5) and a second terminal (3) of the second input resistor (6). The differential input voltage has a common mode component that extends through both a positive and negative voltage range. The instrumentation amplifier also includes a second operational amplifier (7B) having an inverting input coupled to the first terminal of the first resistor (5), a non-inverting input coupled to the first terminal of the second resistor (6), and an output (10B) coupled to a control electrode (e.g., base) of a second output transistor (Q2) and a control electrode (e.g., base) of a level translation transistor (Q3), the second output transistor (Q2) having a first electrode (e.g., emitter) coupled to a second reference voltage (V+) and a second electrode (e.g., collector) coupled to the first terminal of the second resistor (6), the level translation transistor (Q3) having a first electrode (e.g., emitter) coupled to the second reference voltage (V+) and a second electrode (e.g., collector) coupled to the first output conductor (11AB). The instrumentation amplifier further includes offset adjustment circuitry including an offset control amplifier (17) having a non-inverting input and an inverting input for receiving a differential error signal representative of a difference between an offset voltage of the first operational amplifier (7A) and an offset voltage of the second operational amplifier (7B). A first transistor (Q5) has a control electrode (e.g., base) coupled to the output (10A) of the first operational amplifier (7A), a first electrode (e.g., emitter) coupled to the non-inverting input of the offset control amplifier (17), and a second electrode (collector) coupled to the second reference voltage (V+). A second transistor (Q4) has a control electrode (e.g., base) coupled to the output (10B) of the second operational amplifier (7B), a first electrode (e.g., emitter) coupled to the second reference voltage (V+), and a second electrode (collector) coupled to the inverting input of the offset control amplifier (17). The offset control amplifier (17) includes a first offset adjustment output (23-1,2) operatively coupled to adjust an offset voltage of one of the first (7A) and (7A) operational amplifiers. The offset adjustment circuitry operates so as to minimize a difference between offset voltages of the first (7A) and second (7B) operational amplifiers.

In the described embodiments, the first offset adjustment output (23-1,2) is operatively coupled to adjust an offset voltage of the second operational amplifier (7B), and the offset control amplifier a (17) includes a second offset adjustment output (23-3,4) operatively coupled to adjust an offset voltage of the first operational amplifier (7A). The first (Q1) and second (Q2) output transistors, the level translation transistor (Q3), and the first (Q5) and second (Q4) transistors are bipolar transistors wherein each control electrode is a base, each first electrode is an emitter, and each second electrode is a collector. The first offset adjustment output (23-1,2) includes first (23-1) and second (23-2) offset adjustment conductors which conduct a first differential offset adjustment signal, and the second offset adjustment output (23-3,4) includes third (23-3) and fourth (23-4) offset adjustment conductors which conduct a second differential offset adjustment signal. The offset adjustment circuitry includes a first sensing resistor (18) coupled between the non-inverting input of the offset control amplifier (17) and the first reference voltage (GND) and a second sensing resistor (19) coupled between the inverting input of the offset control amplifier (17) and the first reference voltage (GND).

In the described embodiments, the first output transistor (Q1) and the first transistor (Q5) are NPN transistors, wherein the second output transistor (Q2), the level translation transistor (Q3), and the second transistor (Q4) are PNP transistors. The offset control amplifier (17) includes first (MP1) and second (MP2) P-channel transistors and first (MN1) and second (MN2) N-channel transistors. The first P-channel transistor (MP1) has a gate coupled to the inverting input of the offset control amplifier (17), a drain coupled to the first offset adjustment conductor (23-1), and a source coupled to a source of the first N-channel transistor (MN1). A drain of the first N-channel transistor (MN1) is coupled to the third offset adjustment conductor (23-3), the second P-channel transistor (MP2) has a gate coupled to the non-inverting input of the offset control amplifier (17), a drain coupled to the second offset adjustment conductor (23-2), and a source coupled to a source of the second N-channel transistor (MN2). A source of the second N-channel transistor (MN2) is coupled to the fourth offset adjustment conductor (23-4). A bias source (Ibias,MN3,MP3,MP4) is coupled to gates of the first (MN1) and second (MN2) N-channel transistors. The first (23-1) and second (23-2) offset adjustment conductors are coupled to drains of first (45) and second (46) differentially coupled input transistors of the second operational amplifier (7B), and the third (23-3) and fourth (23-4) offset adjustment conductors are coupled to drains of first (45) and second (46) differentially coupled input transistors of the first operational amplifier (7A). The bias source includes a third P-channel transistor (MP3) having a gate coupled to the non-inverting input of the offset control amplifier (17), a drain coupled to the first reference voltage (GND), and a source coupled to a source of a third N-channel transistor (MN3). A fourth P-channel transistor (MP4) has a gate coupled to the inverting input of the offset control amplifier (17), a drain coupled to the first reference voltage (GND), and a source coupled to the source of the third P-channel transistor (MP3), a gate and drain of the third N-channel transistor (MN3) being coupled to gates of the first (MN1) and second (MN2) N-channel transistors and to a current source (Ibias).

In the described embodiments, the drains (or collectors) of the first (45) and second (46) differentially coupled input transistors of the first operational amplifier (7A) are coupled to a folded cascode circuit (48) of the first operational amplifier (7A), an output of which drives an output stage (70A) of the first operational amplifier (7A). The drains (or collectors) of the first and second differentially coupled input transistors of the second operational amplifier (7B) are coupled to a folded cascode circuit of the second operational amplifier (7B), an output of which drives an output stage of the second operational amplifier (7B).

In a described embodiment, the offset control amplifier (17) is operatively coupled to the first (7A) and second (7B) operational amplifiers so as to cause one of them to dominate the other within a transition region between positive and negative values of a common mode component of the differential input voltage in order to prevent abrupt and/or indeterminate values of an output voltage produced on the first output conductor (11AB) within the transition region.

DETAILED DESCRIPTION OF THE PREFERRED EMBODIMENTS

Figure 2:
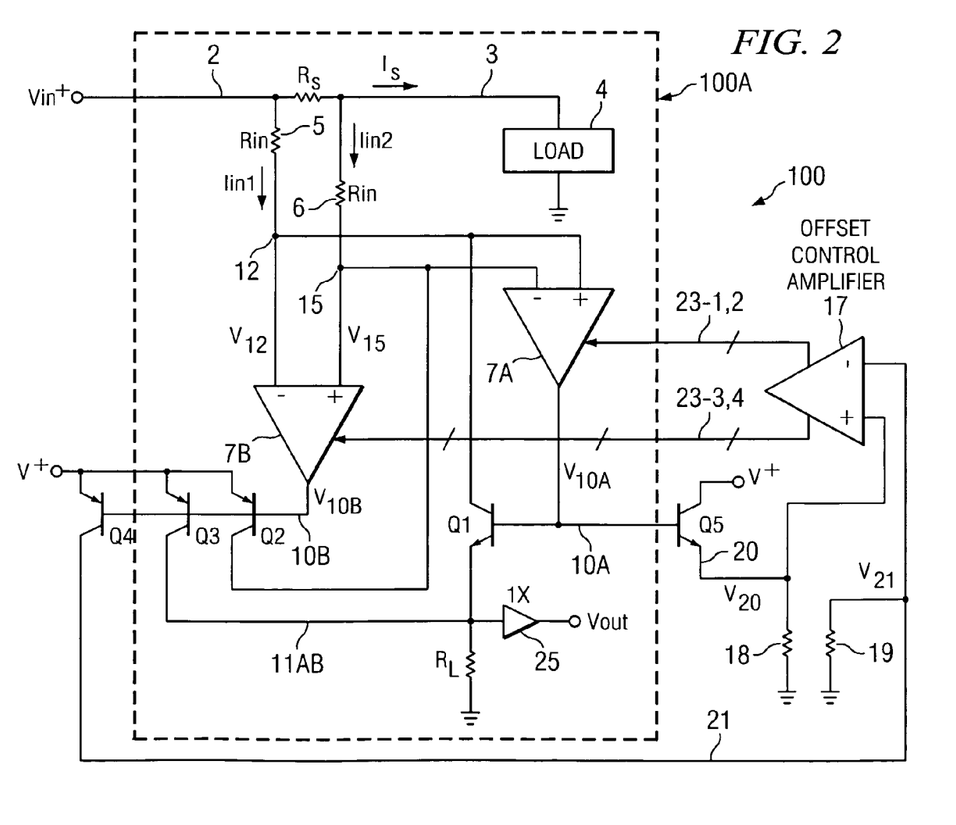
FIG. 2 is a basic schematic diagram of a instrumentation amplifier structure that is operable with both a positive common mode input voltage and a negative common mode input voltage.

Referring to FIG. 2, instrumentation amplifier 100 includes the same structure shown in prior art FIG. 1, with operational amplifier 7A having its (−) input connected to conductor 15 and its (+) input connected to conductor 12. As in FIG. 1, conductor 12 is coupled to one terminal of precision input resistor 5, which may, for example, have a resistance Rin equal to 5 kilohms. The other terminal of resistor 5 is coupled by conductor 2 to receive input voltage Vin+ and also is connected to one terminal of sense resistor $R_S$, the other terminal of which is connected by conductor 3 to one terminal of external load 4, the other terminal of which is connected to ground. Sense resistor $R_S$ has a very low resistance, typically 10 milliohms, and current $I_S$ flows through sense resistor $R_S$ into load 4 in response to a positive value of Vin+. The current $I_S$ develops a small sense voltage across sense resistor $R_S$. Conductor 3 is connected to one terminal of precision input resistor 6, which also has resistance Rin. The other terminal of resistor 6 is connected by conductor 15 to the (−) input of operational amplifier 7A. As in FIG. 1, the output 10A of operational amplifier 7A is connected by conductor 10A to the base of NPN transistor Q1, the emitter of which is connected by conductor 11AB to load resistor $R_L$. The collector of transistor Q1 is connected to conductor 12 to provide feedback to the (+) input of operational amplifier 7A. The output 10A of operational amplifier 7A also is connected to the base of an NPN transistor Q5, which is not present in FIG. 1.

In accordance with the present invention, instrumentation amplifier 100 also includes an operational amplifier 7B having a (+) input connected to conductor 15 and a (−) input connected to conductor 12. The output of operational amplifier 7B is connected by conductor 10B to the bases of PNP current mirror transistors Q2, Q3 and Q4. The emitters of current mirror transistors Q2, Q3 and Q4 are connected to positive supply voltage V+. The collector of current mirror transistor Q2 is connected by conductor 15 to supply feedback to the (+) input of operational amplifier 7B. The collector of level-shifting current mirror transistor Q3 is connected to conductor 11AB, which is connected to the input of a unity gain buffer amplifier 25, the output of which produces Vout. The value of Vout is given by the previously mentioned expression Vout=($I_S$)($R_S$)($R_L$)/Rin. Transistors Q2 and Q3 function as a current mirror in order to enable transistor Q3 to translate the signal $V_{10B}$ on conductor 10B to lower voltage levels in order to extend the common mode input voltage range of instrumentation amplifier 100 to negative voltages.

The accuracy of the foregoing translation of $V_{10B}$ depends on precise matching of transistors Q2 and Q3. However, transistors Q2 and Q3 are not precisely matched over either a wide collector current range or a wide collector voltage range, because the collector voltages are substantially different during circuit operation and therefore the collector currents of transistors Q2 and Q3 are not well matched either. The imprecise matching of transistors Q2 and Q3 causes accuracy problems, such as gain accuracy problems. However, these problems can be avoided by using the circuit of subsequently described FIG. 5 in place of the NPN current mirror transistors Q2 and Q3.

The above-described portion of instrumentation amplifier 100 constitutes a "basic" instrumentation amplifier 100A of the present invention. If the input offset voltages of operational amplifiers 7A and 7B are not equal, basic instrumentation amplifier 100A produces inaccuracies and abrupt changes in the output voltage Vout as the common mode input voltage applied to basic instrumentation amplifier 100A undergoes a transition between its positive and negative ranges.

Figure 4:
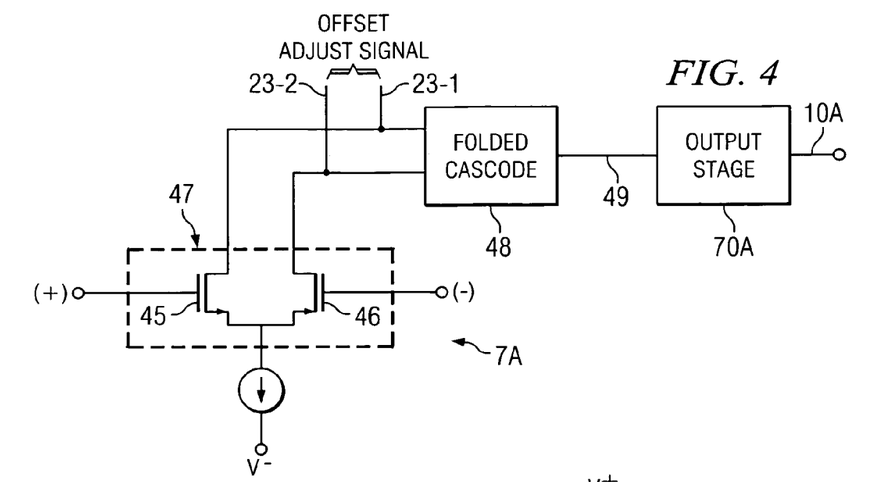
FIG. 4 is a schematic diagram that illustrates circuitry inside operational amplifiers 7A and 7B and connections thereof to offset adjustment conductors 23-1 and 23-2 as shown in FIGS. 2 and 3.

Referring to FIG. 4, operational amplifier 7A has its (+) input coupled to the gate of N-channel transistor 45, and has its (−) input coupled to the gate of N-channel transistor 46, the source of which is connected to the source of transistor 45. (Transistors 45 and 46 are illustrated as a differentially-coupled input pair 47 of N-channel transistors, but as a practical matter, the input pair 47 could include or be composed of P-channel transistors, PNP transistors, or NPN transistors.) The sources of transistors 45 and 46 are also connected to a tail current source. The drain of transistor 45 is connected by offset adjustment conductor 23-1 to one input of a conventional folded-cascode circuit 48, and the drain of transistor 46 is connected by an offset adjustment conductor 23-2 to another input of folded cascode circuit 48. The effective offset voltage of operational amplifier 7A can be adjusted by adding or subtracting offset adjustment currents in conductors 23-1 and 43-2 to the drain (or collector) currents of the transistors 46 and 45, respectively, of input pair 47. The output 49 of folded cascode circuit 48 is connected to the input of an output stage 70A, the output of which is connected to conductor 10A. The configuration of amplifier 7B is similar or identical to that of operational amplifier 7A.

Referring again to FIG. 2, instrumentation amplifier 100 also includes an offset control amplifier 17 that operates to control the offset voltages of operational amplifiers 7A and 7B. (Offset control amplifier 17 can be configured to provide either single-ended or double-ended control.) The output of operational amplifier 7B drives the base of PNP current mirror output transistor Q4. The collector of transistor Q4 is connected by conductor 21 to the (−) input of offset control amplifier 17 and to one terminal of an offset-imbalance-sensing resistor 19, the other terminal of which is connected to ground. Similarly, the output of operational amplifier 7A drives the base of an NPN transistor Q5, the emitter of which is connected by conductor 20 to the (+) input of offset control amplifier 17 and to one terminal of another offset-imbalance-sensing resistor 18, the other terminal of which also is connected to ground.

Offset control amplifier 17 includes a differential output on conductors 23-1 and 23-2, which are connected to the drains of differential input transistors 45 and 46 of operational amplifier 7A, respectively, as shown in FIG. 4. Offset control amplifier 17 also includes another differential output on conductors 23-3 and 23-4, which are connected to the drains of a pair of differential input transistors, respectively, (not shown) of operational amplifier 7B, the configuration of which is identical or similar to that shown in FIG. 4.

In accordance with the present invention, the differential outputs 23-1,2 and 23-3,4 conduct differential offset adjustment currents generated by offset control amplifier 17 into or out of corresponding input stages of operational amplifiers 7A and 7B, respectively, generally as indicated in FIG. 4.

Offset control amplifier 17 operates to force the effective offset voltages of operational amplifiers 7A and 7B to be equal. Specifically, operational amplifiers 7A and 7B operate to cause approximately the same amount of current to be contributed by transistors Q1 and Q3 to the current in load resistor $R_L$. Offset control amplifier 17 in effect compares the currents contributed by transistors Q1 and Q2 to produce Vout and uses that information to force the effective offset voltages of operational amplifiers 7A and 7B to be equal to thereby eliminate the subsequently described "competition" between them.

Still referring to FIG. 2, "basic" instrumentation amplifier 100A excludes the offset-adjusting circuitry including offset control amplifier 17, transistors Q4 and Q5, and sense resistors 18 and 19. In basic instrumentation amplifier circuit 100A, the common mode ranges of operational amplifiers 7A and 7B overlap. While in the overlapping common mode input range, both operational amplifiers 7A and 7B are operative and attempt to determine the value of Vout. However, this causes a problem of "competition" between operational amplifier 7A along with its associated output drive transistor Q1 and operational amplifier 7B along with its associated output drive transistor Q3 if the "intrinsic" input offset voltages of operational amplifiers 7A and 7B are different.

The "competition" referred to occurs in this case because each of operational amplifiers 7A and 7B attempts to set a different value of Vout. As a result, the operational amplifier 7A or 7B having the higher feedback current sets the higher value of Vout, and the other one attempting to set the lower value of Vout is in effect "cut off". For example, if the input offset voltage mismatch between operational amplifiers 7A and 7B is such that operational amplifier 7A tries to set Vout to a higher value than operational amplifier 7B, then transistor Q1 simply provides enough current through load resistor $R_L$ to raise the voltage on conductor 11AB (and hence Vout) to that higher value and in effect "overpowers" operational amplifier 7B. On the other hand, if the input offset voltage mismatch is such that operational amplifier 7B tries to set Vout to a higher value than operational amplifier 7A, then transistor Q3 supplies enough current through load resistor $R_L$ to set the voltage on conductor 11AB (and hence Vout) to that higher value. This decreases the base-to-emitter voltage of transistor Q1, turning it off and in effect "overpowering" operational amplifier 7A.

Figure 6:
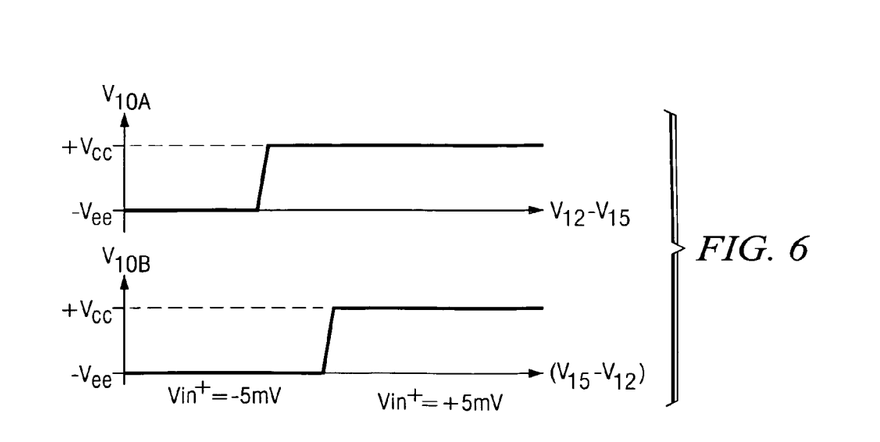
FIG. 6 is a diagram useful in explaining operation of the "basic" instrumentation amplifier 100A shown in FIG. 2.

The foregoing operation causes abrupt changes and indeterminate inaccuracies in Vout as the common mode input voltage undergoes transitions between positive and negative values. Such abrupt, discontinuous transitions of Vout are produced in response to the output voltages $V_{10A}$ and $V_{10B}$ of operational amplifiers 7A and 7B, respectively, and are caused by mismatching or unequal offset voltages of operational amplifiers 7A and 7B. FIG. 6 illustrates $V_{10A}$ and $V_{10B}$ for the case where the initial or intrinsic input offset voltage of operational amplifier 7A is substantially greater than that of operational amplifier 7B. When there is such a mismatch in the input offset voltages of operational amplifiers 7A and 7B, only one of the two operational amplifiers can be in a linear mode, and the output of the other is driven to either the positive or negative power supply voltage. The above mentioned abrupt changes and indeterminate inaccuracies in Vout occurs during the gap between the transitions of V10A and $V_{10B}$ as shown in FIG. 6.

According to the present invention, these problems are solved by the structure and operation of instrumentation amplifier 100, which includes above mentioned basic instrumentation amplifier circuit 100A and further includes current mirror transistors Q4 and Q5, current sense resistors 18 and 19, and offset control amplifier 17, which produces offset adjustment signals on conductors 23-1,2 and applies them to the input stage of operational amplifier 7A (as shown in FIG. 4) and also produces offset adjustment signals on conductors 23-3,4 and applies them to the input stage of operational amplifier 7B.

Ideally, operational amplifiers 7A and 7B in basic instrumentation amplifier 100A are perfectly matched and therefore both contribute the same amount of current to resistor $R_L$, So ideally, operational amplifiers 7A and 7B do not compete with each other as described above to provide current to resistor $R_L$, and basic instrumentation amplifier 100A operates smoothly as the common mode input voltage of Vin+ moves from negative to positive values.

But even though both of operational amplifiers 7A and 7B theoretically can operate together to control the overall instrumentation amplifier operation over a middle part of the common mode input voltage range, as a practical matter only one of them actually does because their input offset voltages are never precisely matched. Since the input offset voltages of operational amplifiers 7A and 7B are significantly mismatched (and may even thermally drift in opposite directions), their operation during the gap between their input offset voltages causes indeterminate values of Vout, i.e., indeterminate behavior of instrumentation amplifier 100 of FIG. 2.

To avoid the foregoing indeterminate values of Vout as Vin+ undergoes transitions between positive and negative portions of the common mode input range of instrumentation amplifier 100, the present invention provides the above described offset adjustment circuitry including offset control amplifier 17, sense resistors 18 and 19, and transistors Q4 and Q5. This offset adjustment circuitry operates to in effect impose an additional amount of input offset voltage on the "intrinsic" input offset voltage of both of operational amplifiers 7A and 7B connected in the illustrated "parallel" configuration thereof.

Specifically, the use of offset control amplifier 17 as shown in FIG. 2 controls the effective offset voltages of operational amplifiers 7A and 7B by means of feedback from their respective outputs and corresponding sense resistors 17 and 18, through offset control amplifier 17 and its outputs 23-1,2 and 23-3,4, to the offset adjustment inputs of operational amplifiers 7A and 7B, respectively, in such a way as to provide a smooth, "seamless" transition in the operation of amplifiers 7A and 7B as Vin+ moves through a voltage range in which the common mode input voltage on conductors 2 and 3 changes between positive to negative values. This smooth transition occurs even if the input offset voltages of operational amplifiers 7A and 7B are substantially mismatched.

Current-sensing resistors 18 and 19 are coupled to the output transistors Q1 and Q3 and detect whether the currents through current mirror transistors Q4 and Q5 provide an indication to offset control amplifier 17 of whether operational amplifiers 7A and 7B are "competing", by in effect determining whether they are causing different amounts of current to be delivered to load resistor $R_L$. Current-sensing resistors 18 and 19 and offset control amplifier 17 operate to force the currents in transistors Q4 and Q5 driven by operational amplifiers 7A and 7B to be equal by controlling their effective input offset voltages and causing the output voltages $V_{10A}$ and $V_{10B}$ of operational amplifiers 7A and 7B to be equal.

For example, if the offset voltage of operational amplifier 7A is 1 millivolt and the offset voltage of 7B is zero, transistor Q1 initially conducts current required for balancing the inputs of operational amplifier 7A so as to correspond to the 1 millivolt offset, and transistors Q2 and Q3 are turned off. The voltage $V_{20}$ on conductor 20 is approximately equal to Vout, and the voltage $V_{21}$, on conductor 21 is zero, so there is a voltage difference between the inputs of offset control amplifier 17 that corresponds to the 1 millivolt offset of operational amplifier 7A. In response, the outputs of offset control amplifier 17 control the effective input offset voltages of operational amplifiers 7A and 7B so as to reduce the effective input offset voltage of operational amplifier 7A and increase the effective input offset voltage of operational amplifier 7B. Therefore, the input offset voltages of operational amplifiers 7A and 7B move toward each other and become equal at some point, e.g., both become equal to approximately 0.5 millivolts. By then, transistors Q2, Q3 and Q4 are conducting current. When transistor Q2 generates approximately the same amount of current as transistor Q1 so that the associated output drive transistors Q5 and Q4 also generate equal currents, then the difference voltage $V_{20}-V_2$, between the inputs of offset adjustment amplifier 17 becomes zero to produce a balanced condition, and offset control amplifier 17 makes no further change to the input offset voltages of operational amplifiers 7A and 7B.

Figure 3:
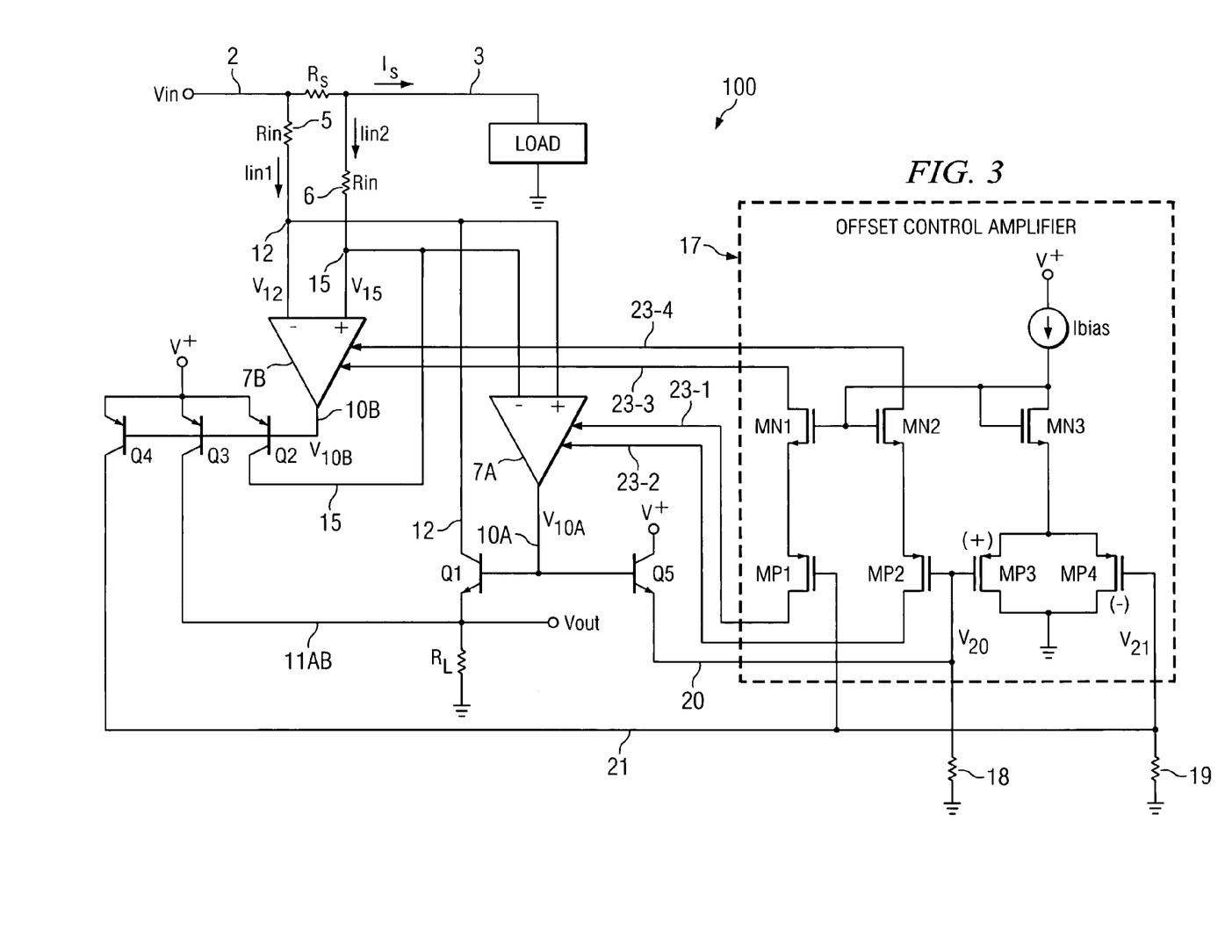
FIG. 3 is a more detailed schematic diagram of the instrumentation amplifier circuit as shown in FIG. 2.

FIG. 3 shows a more detailed implementation of FIG. 2, further including details of offset control amplifier 17. Offset control amplifier 17 includes a pair of differentially coupled P-channel input transistors MP1 and MP2 having their gates connected to conductors 21 and 20, respectively. The drains of transistors MP1 and MP2 are connected to conductors 23-1 and 23-2, respectively. The sources of transistors MP1 and MP2 are connected to the sources of a pair of differentially coupled N-channel transistors MN1 and MN2, respectively. The drains of transistors MN1 and MN2 are connected to conductors 23-3 and 23-4, respectively. Conductors 20 and 21 are also connected to the gates of a pair of P-channel transistors MP3 and MP4, respectively, the drains of which are connected to ground. The sources of transistors MP3 and MP4 are connected to the source of a diode-connected N-channel transistor MN3 having its gate and drain coupled to one terminal of a bias current source Ibias and are also coupled to the gates of transistors MN1 and MN2.

Offset control amplifier 17 adjusts the input offset voltage of operational amplifier 7A by subtracting the current through transistors MP1 and MN1 and the current through transistors MP2 and MN2 from the drain conductors of the input transistors of the differential stage of operational amplifier 7A via conductors 23-1 and 23-2, respectively. Similarly, offset control amplifier 17 adjusts the input offset voltage of operational amplifier 7B by adding the same current through transistors MP1 and MN1 and the same current through transistors MP2 and MN2 into the drain conductors of the input transistors such as 45 and 46 of FIG. 4, respectively, of the differential stage of operational amplifier 7B via conductors 23-3 and 23-4, respectively. (It should be appreciated that those skilled in the art could readily devise, other circuits which could accomplish similar input offset voltage adjustments.)

Figure 5:
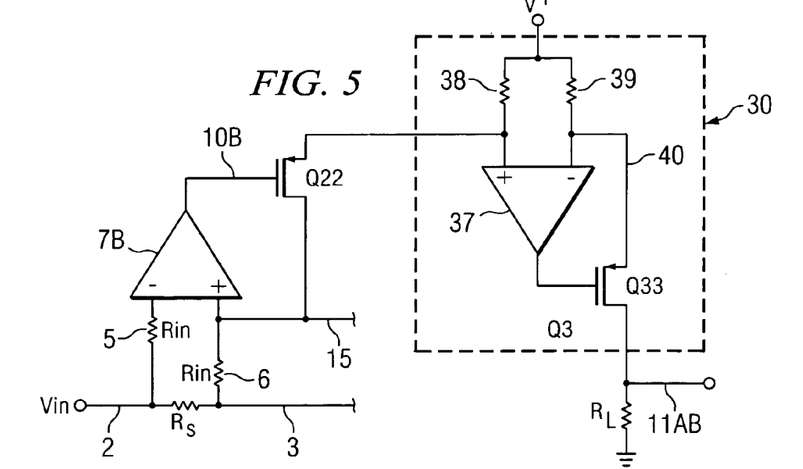
FIG. 5 is a schematic diagram that illustrates an improved way of implementing the current mirror circuitry including transistors Q2 and Q3 in FIGS. 2 and 3.

As mentioned earlier, the circuit of FIG. 5 can be used to replace transistors Q2 and Q3 in FIG. 3 and avoid the problems caused by mismatching of transistors Q2 and Q3. Referring to FIG. 5, the source of a P-channel transistor Q22 is connected to one terminal of a resistor 38 and to the (+) input of an operational amplifier 37. The other terminal of resistor 38 is connected to V+. Similarly, the source of a P-channel transistor Q33 is connected to one terminal of a resistor 39 and to the (−) input of operational amplifier 37. The other terminal of resistor 39 is connected to V+. Resistors 38 and 39 have precisely matched resistances. The gate of transistor Q22 is connected by conductor 10B to the output of operational amplifier 7B of FIG. 3. The (−) input of operational amplifier 7B is connected to one terminal of input resistor 5 of FIG. 3, the other terminal of which is connected to conductor 2 of FIG. 3. The drain of transistor Q22 is connected by conductor 15 to the (+) input of operational amplifier 7B and one terminal of input resistor 6 of FIG. 3, the other terminal of which is connected to conductor 3 of FIG. 3. The gate of transistor Q33 is connected to the output of operational amplifier 37. The drain of transistor Q33 is connected by Vout conductor 11AB to one terminal of load resistor $R_L$. Transistor Q22 in FIG. 5 in effect replaces transistor Q2 of FIG. 3, and the circuitry enclosed by dashed line 30 in FIG. 5 in effect replaces transistor Q3 of FIG. 3. Amplifier 37 and transistors Q22 and Q33 operate to translate signal voltages to lower levels without relying on the matching of transistors Q22 and Q33, and instead rely on precise matching of resistors 38 and 39 and on the precision of amplifier 37. The circuit of FIG. 5, if connected as indicated so as to replace transistors Q2 and Q3 in FIG. 3, allows precise matching of resistors 38 and 39 in FIG. 5 instead of requiring precise matching of transistors Q2 and Q3 in the implementation of FIG. 3. The needed precise matching of resistors 38 and 39 is likely to be more easily and economically achieved than the needed precise matching of transistors Q2 and Q3. If the precision current mirror circuitry shown in FIG. 5 is utilized, then a resistor (not shown) equal to or precisely scaled with respect to resistors 38 and 39 should be connected between the emitter of transistor Q4 and V+. Also, if the precision current mirror circuitry shown in FIG. 5 is utilized, the base of transistor Q4 can be connected either to conductor 10B or to the gate of transistor Q33, although frequency compensation might be more difficult in the latter case.

A main benefit of the present invention is that provides an instrumentation amplifier which has a large positive and negative common mode input voltage range, with smooth, seamless operation as the common mode input voltage varies between the positive and negative portions of its range, so as to provide stable, accurate values of Vout across the entire positive and negative common mode input voltage range. The invention accomplishes this by providing an offset adjustment circuit which provides smooth, seamless operation of two parallel-connected operational amplifiers which individually have a positive input common mode range and a negative input common mode range, respectively, in such a way that abrupt changes and indeterminate values of the instrumentation amplifier output voltage are avoided.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, those skilled in the art could readily modify the circuitry to utilize MOS transistors in place of some or all of bipolar transistors Q1–5. Also, those skilled in the art could modify the design so that the resistances of and currents through input resistors 5 and 6 are precisely scaled, rather than equal.

What is claimed is:

1. An amplifier circuit comprising:
   (a) first and second amplifiers connected in a parallel configuration;
   (b) first and second input resistances, a first terminal of the first input resistance being coupled to one input of both of the first and second amplifiers, a first terminal of the second input resistance being coupled to another input of both of the first and second amplifiers, a differential input signal having both an upper and a lower common mode range being applied between a second terminal of the first input resistance and a second terminal of the second input resistance;
   (c) a circuit for combining output signals of the first and second amplifiers to produce an output signal representative of feedback currents produced in the first and second input resistances in response to output signals of the first and second amplifiers, respectively; and
   (d) an offset adjustment amplifier receiving a differential signal representative of a difference between offset voltages of the first and second amplifiers for generating offset adjustment signals and applying the offset adjustment signals to adjust the offset voltage of at least one of the first and second amplifiers to cause the first and second amplifiers to operate seamlessly as a common mode component of the differential input signal undergoes a transition between its upper and lower common mode ranges.

2. An amplifier circuit comprising:
   (a) a first operational amplifier having a first input coupled to a first terminal of a first input resistor, a second input of polarity opposite to the polarity of the first input thereof coupled to a first terminal of a second input resistor, and an output coupled to a control electrode of a first output transistor, the first output transistor having a first electrode coupled to a first output conductor and a first terminal of a load and a second electrode coupled to the first terminal of the first resistor, the resistor having a second terminal coupled to a first reference voltage, a differential input voltage being applied between a second terminal of the first input resistor and a second terminal of the second input resistor, the differential input voltage having a common mode component;
   (b) a second operational amplifier having a first input coupled to the first terminal of the first input resistor, a second input coupled to the first terminal of the second input resistor, and an output coupled to a control electrode of a second output transistor and a control electrode of a level translation transistor, the second output transistor having a first electrode coupled to a second reference voltage and a second electrode coupled to the first terminal of the second resistor, the level translation transistor having a first electrode coupled to the second reference voltage and a second electrode coupled to the first output conductor; and
   (c) offset adjustment circuitry including
      i. an offset control amplifier having a first input and a second input of polarity opposite to the polarity of the first input thereof for receiving a differential signal representative of a difference between an offset voltage of the first operational amplifier and an offset voltage of the second operational amplifier,
      ii. a first transistor having a control electrode coupled to the output of the first operational amplifier, a first electrode coupled to the first input of the offset control amplifier, and a second electrode coupled to the second reference voltage, and a second transistor having a control electrode coupled to the output of the second operational amplifier, a first electrode coupled to the second reference voltage, and a second electrode coupled to the second input of the offset control amplifier, and
      iii. the offset control amplifier including a first offset adjustment output operatively coupled to adjust an offset voltage of one of the first and operational amplifiers.

3. The amplifier circuit of claim 2 wherein the first offset adjustment output is operatively coupled to adjust the offset voltage of the second operational amplifier and wherein the offset control amplifier includes a second offset adjustment output operatively coupled to adjust the offset voltage of the first operational amplifier.

4. The amplifier circuit of claim 3 wherein the first and second output transistors, the level translation transistor, and the first and second transistors are bipolar transistors wherein each control electrode is a base, each first electrode is an emitter, and each second electrode is a collector.

5. The amplifier circuit of claim 4 wherein the first offset adjustment output includes first and second offset adjustment conductors which conduct a first differential offset adjustment signal, and wherein the second offset adjustment output includes third and fourth offset adjustment conductors which conduct a second differential offset adjustment signal.

6. The amplifier circuit of claim 3 wherein the first and second inputs of the offset control amplifier are non-inverting and inverting inputs, respectively, and wherein the offset adjustment circuitry includes a first sensing resistor coupled between the non-inverting input of the offset control amplifier and the first reference voltage and a second sensing resistor coupled between the inverting input of the offset control amplifier and the first reference voltage.

7. The amplifier circuit of claim 5 wherein the first and second inputs of the offset control amplifier are non-inverting and inverting inputs, respectively, and wherein the first output transistor and the first transistor are NPN transistors, wherein the second output transistor, the level translation transistor, and the second transistor are PNP transistors, wherein the offset control amplifier includes first and second P-channel transistors and first and second N-channel transistors, the first P-channel transistor having a gate coupled to the inverting input of the offset control amplifier, a drain coupled to the first offset adjustment conductor, and a source coupled to a source of the first N-channel transistor, a drain of the first N-channel transistor being coupled to the third offset adjustment conductor, the second P-channel transistor having a gate coupled to the non-inverting input of the offset control amplifier, a drain coupled to the second offset adjustment conductor, and a source coupled to a source of the second N-channel transistor, a source of the second-channel transistor being coupled to the fourth offset adjustment conductor, a bias source being coupled to gates of the first and second N-channel transistors.

8. The amplifier circuit of claim 7 wherein the first and second offset adjustment conductors are coupled to drains of first and second differentially coupled input transistors of the second operational amplifier, and the third and fourth offset adjustment conductors are coupled to drains of first and second differentially coupled input transistors of the first operational amplifier.

9. The amplifier circuit of claim 8 wherein the bias source includes a third P-channel transistor having a gate coupled to the non-inverting input of the offset control amplifier, a drain coupled to the first reference voltage, and a source coupled to a source of a third N-channel transistor, a fourth P-channel transistor having a gate coupled to the inverting input of the offset control amplifier, a drain coupled to the first reference voltage, and a source coupled to the source of the third P-channel transistor, a gate and drain of the third N-channel transistor being coupled to gates of the first and second N-channel transistors and to a current source.

10. The amplifier circuit of claim 3 wherein the first offset adjustment output adjusts the offset voltage of the first operational amplifier in a first direction and the second offset adjustment output adjusts the offset voltage of the second operational amplifier in a second direction opposite to the first direction.

11. The amplifier circuit of claim 8 wherein the drains of the first and second differentially coupled input transistors of the first operational amplifier are coupled to a folded cascode circuit of the first operational amplifier, an output of which folded cascode circuit drives a class AB output circuit of the first operational amplifier, and wherein the drains of the first and second differentially coupled input transistors of the second operational amplifier are coupled to a folded cascode circuit of the second operational amplifier, an output of which folded cascode circuit drives a class AB output circuit of the second operational amplifier.

12. The amplifier circuit of claim 2 wherein the first and second input resistors are precisely matched.

13. The amplifier circuit of claim 2 wherein the offset adjustment circuitry operates so as to minimize a difference between the offset voltages of the first and second operational amplifiers.

14. The amplifier circuit of claim 2 wherein the first electrode of the second output transistor is coupled to the second reference voltage by means of a first resistor, the first electrode of the level translation transistor is coupled to the second reference voltage by means of a second resistor which is precisely matched to the first resistor, and the control electrode of the level translation transistor is controlled by means of an operational amplifier having a first input coupled to the first electrode of the second output transistor, a second input of polarity opposite to the first input thereof coupled to the first electrode of the level translation transistor, and an output coupled to the control electrode of the level translation transistor.

15. The amplifier circuit of claim 2 wherein the offset control amplifier is operatively coupled to the first and second operational amplifiers so as to cause one of them to dominate the other within a transition region between upper and lower values of a common mode component of the differential input voltage in order to prevent abrupt and/or indeterminate values of an output voltage produced on the first output conductor within the transition region.

16. A method of operating an amplifier circuit which includes i. a first operational amplifier having a first input coupled to a first terminal of a first input resistor, a second input of polarity opposite to the polarity of the first input thereof coupled to a first terminal of a second input resistor, and an output coupled to a control electrode of a first output transistor, the first output transistor having a first electrode coupled to a first output conductor and a first terminal of a load and a second electrode coupled to the first terminal of the first resistor, the load having a second terminal coupled to a first reference voltage, a differential input voltage being applied between a second terminal of the first input resistor and a second terminal of the second input resistor, the differential input voltage having a common mode component, and ii. a second operational amplifier having a first input coupled to the first terminal of the first resistor, a second input of polarity opposite to the polarity of the first input thereof coupled to the first terminal of the second resistor, and an output coupled to a control electrode of a second output transistor and a control electrode of a level translation transistor, the second output transistor having a first electrode coupled to a second reference voltage and a second electrode coupled to the first terminal of the second resistor, the level translation transistor having a first electrode coupled to the second reference voltage and a second electrode coupled to the first output conductor, the method comprising:

(a) producing a differential signal representative of a difference between an offset voltage of the first operational amplifier and an offset voltage of the second operational amplifier;

(b) sensing the differential error signal by means of an offset control amplifier; and (c) operating the offset control amplifier to produce a first offset adjustment signal and adjusting the offset voltage of one of the first and the second operational amplifiers in response to the first offset adjustment signal.

17. The method of claim 16 wherein step (c) includes adjusting the offset voltage of the second operational amplifier in response to the first offset adjustment signal and wherein step (c) also includes operating the offset control amplifier to produce a second offset adjustment signal and adjusting the offset voltage of the first operational amplifier in response to the second offset adjustment signal.

18. The method of claim 17 wherein step (c) includes operating the offset control amplifier to substantially equalize the offset voltages of the first and second operational amplifiers.

19. The method of claim 17 wherein step (a) includes coupling a signal including a component representative of the offset voltage of the first operational amplifier from the output of the first operational amplifier to a first input of the offset control amplifier, and coupling a signal representative of a component of the offset voltage of the second operational amplifier from the output of the second operational amplifier to a second input of the offset control amplifier of polarity opposite to the polarity of the first input thereof.

20. The method of claim 17 wherein the adjusting of the offset voltage of the second operational amplifier includes applying the first offset adjustment signal between output conductors of a differential input stage of the second differential amplifier, and wherein adjusting the offset voltage of the first operational amplifier includes applying the second offset adjustment signal between output conductors of a differential input stage of the first differential amplifier.

* * * * *